(12) United States Patent
Frost et al.

(10) Patent No.: US 10,101,402 B2
(45) Date of Patent: Oct. 16, 2018

(54) ESTIMATION OF BATTERY POWER CAPABILITY IN A TORQUE-GENERATING SYSTEM

(71) Applicant: GM GLOBAL TECHNOLOGY OPERATIONS LLC, Detroit, MI (US)

(72) Inventors: Patrick E. Frost, Berkley, MI (US); Rory B. Fraga, Troy, MI (US); Patricia M. Laskowsky, Ann Arbor, MI (US); Alexander K. Suttman, West Bloomfield, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 316 days.

(21) Appl. No.: 15/168,742

(22) Filed: May 31, 2016

(65) Prior Publication Data

US 2017/0343613 A1 Nov. 30, 2017

(51) Int. Cl.
*G01R 31/36* (2006.01)
*B60L 11/18* (2006.01)
*B60W 20/13* (2016.01)

(52) U.S. Cl.
CPC ....... *G01R 31/3651* (2013.01); *B60L 11/1851* (2013.01); *B60L 11/1861* (2013.01); *B60W 20/13* (2016.01)

(58) Field of Classification Search
None
See application file for complete search history.

(56) References Cited

U.S. PATENT DOCUMENTS

| 8,129,944 B2 * | 3/2012 | Izumi | B60L 11/1868 320/116 |
| 2015/0028814 A1 * | 1/2015 | Johnson | H02J 7/00 320/134 |
| 2017/0259686 A1 * | 9/2017 | Lee | B60L 11/1844 |

FOREIGN PATENT DOCUMENTS

CN 105738824 A * 7/2016

* cited by examiner

Primary Examiner — John Kuan
(74) Attorney, Agent, or Firm — Quinn IP Law

(57) ABSTRACT

A method for estimating battery power capability in a torque-generating system having a battery pack with battery cells includes calculating a voltage spread as a difference between an average and minimum cell voltage of the battery pack. The method also includes increasing a calibrated voltage control limit by an offset that is based on a magnitude of the voltage spread, doing so when the minimum cell voltage is less than the control limit, and recording the offset in a memory location referenced by pack operating conditions. Further, the power capability is estimated using the recorded offset when the battery pack operates under conditions that are the same as the operating conditions, and then executing a control action of the system using the estimated power capability. A torque-generating system includes the battery pack, an electric machine, and a controller programmed to execute the above-described method.

19 Claims, 3 Drawing Sheets

ESTIMATION OF BATTERY POWER CAPABILITY IN A TORQUE-GENERATING SYSTEM

TECHNICAL FIELD

The present disclosure relates to a method and system for estimating battery power capability in a torque-generating system.

BACKGROUND

High-voltage DC battery packs may be used to energize electric machines in a variety of different torque-generating systems. For instance, the output torque from an electric motor may be used to rotate an input member of a power transmission in a hybrid electric or plug-in electric vehicle, i.e., a vehicle having a battery pack that may be selectively recharged using a charging outlet or offboard power supply. The individual battery cells of a given battery pack gradually age and degrade over time. As a result, battery performance parameters such as open circuit voltage, cell resistance, and state of charge may change relative to calibrated/new values. Battery degradation is therefore monitored by a designated battery controller in order to estimate the remaining amount of battery power capability. The battery power capability estimates thereafter can be used to make powertrain mode selection decisions or to perform other control actions.

Existing battery control methodologies seek to protect relatively weak battery cells in a battery pack, i.e., those battery cells exhibiting the lowest cell voltages during a discharge event or the highest cell voltage during a charge event. Typically, battery protection is achieved by controlling the battery pack voltage in such a way that the lowest cell voltages are forced to remain above a minimum allowed pack voltage. In other words, the battery pack voltage is reactively adjusted in response to a given battery cell approaching or dropping below a voltage control limit or floor. However, changing a voltage control limit, particularly during a power pulse, can reduce the accuracy of battery power capability estimates.

SUMMARY

The present approach is intended to improve upon the overall accuracy of existing battery power capability predictions, particularly those made in conjunction with reactive voltage control strategies of the type noted above. The present method includes recording the past history of reactive voltage control limit adjustments across different operating conditions, e.g., at different states of charge (SOC) and temperatures of the battery pack, and then estimating the power capability of the battery pack under the same operating conditions using the recorded history.

For instance, the method may include estimating a maximum charge and discharge power capability over different impending time windows, e.g., looking ahead 2 seconds and 10 seconds into the immediate future. The power capability estimates may be made at a maximum charge/discharge current, and also at a maximum charge/minimum discharge voltage limit. The controller thereafter selects the power quantity with the smaller relative magnitude and uses this power estimate in a subsequent control action, e.g., powertrain control or electric range estimation and route planning.

In a particular embodiment, a method is disclosed for estimating battery power capability in a torque-generating system having a battery pack with a plurality of battery cells. The method includes calculating a voltage spread via a controller as a difference between an average cell voltage and a minimum cell voltage of the battery pack, and then increasing a calibrated voltage control limit, e.g., by an offset that is based on a magnitude of the voltage spread, when the minimum cell voltage is less than the calibrated voltage control limit. The method also includes recording the offset in a memory location of the controller referenced by the operating conditions of the battery pack. The method proceeds by estimating the power capability of the battery pack using the recorded offset when the battery pack is again operating under conditions that are the same as the operating conditions for the corresponding memory location. The controller then executes a control action of the torque-generating system using the estimated power capability.

The operating conditions of the battery pack may include a state of charge, a temperature of the battery pack, or other suitable operating conditions.

Estimating the power capability of the battery pack may include estimating each of a maximum charging power capability and a maximum discharging power capability over different future time windows. Increasing the calibrated voltage control limit may occur in some embodiments only when the magnitude of the voltage spread exceeds a calibrated voltage spread threshold.

The torque-generating system in the method may include an engine, in which case the control action can include commanding the engine to turn on or off, e.g., a powertrain mode selection or engine stop/start action. When the torque-generating system is a vehicle, the control action may include executing a route planning action of the vehicle.

Estimating the power capability of the battery pack using the recorded offset may include adjusting a voltage level of the battery pack by an amount that is proportional to the voltage spread, and then calculating the power capability using the adjusted voltage.

A torque-generating system is also disclosed that includes a controller programmed to execute the above-described method. In addition to the controller, the system may include the battery pack and an electric machine operable for generating output torque when supplied with electricity from the battery pack.

The above summary is not intended to represent every embodiment or every aspect of the present disclosure. Rather, the foregoing summary merely provides an exemplification of some of the novel aspects and features set forth herein. The above features and advantages, and other features and advantages of the present disclosure, will be readily apparent from the following detailed description of representative embodiments and modes for carrying out the present disclosure when taken in connection with the accompanying drawings and the appended claims.

DETAILED DESCRIPTION

Figure 1:
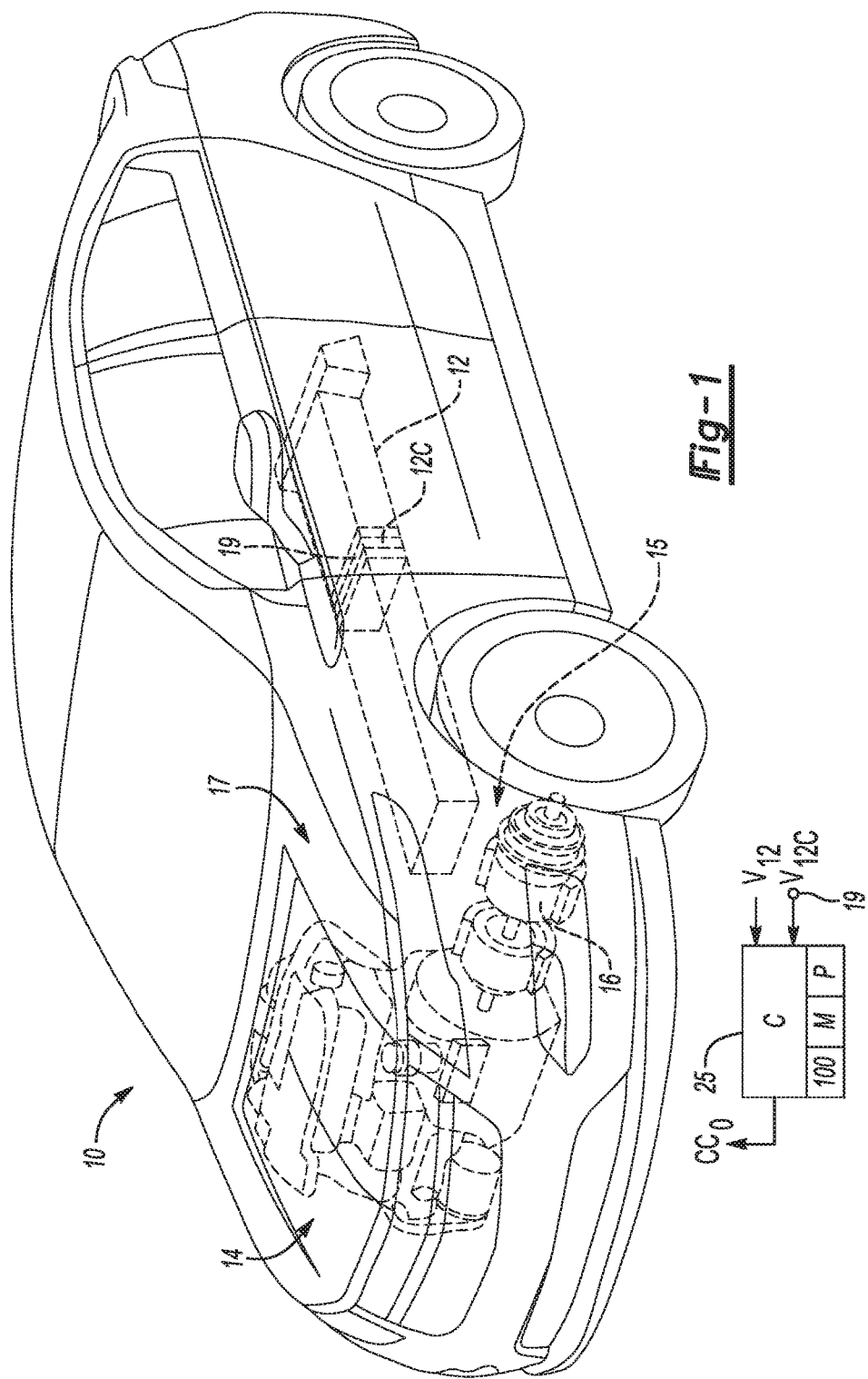
FIG. 1 is a schematic illustration of an example vehicle having a rechargeable battery pack and a system for estimating power capability of the battery pack.

Referring to the drawings, wherein like reference numerals are used to identify like or identical components in the various views, FIG. 1 schematically illustrates a torque-generating system 10 in the form of an example vehicle. The system 10 includes a rechargeable battery pack 12 and a controller (C) 25. The controller 25 is programmed with computer-executable code embodying steps of a method 100, an example of which is described below with reference to FIG. 3 with additional reference to the illustrative time plot of FIG. 2. As part of an overall control methodology, the controller 25 estimates a power capability of the battery pack 12 as explained above, i.e., over a plurality of different future time windows when operating at a maximum charge/discharge current, and also at a maximum charge/minimum discharge voltage limit. The controller 25 then selects the power capability having the smaller relative magnitude and uses the same in the overall control of the system 10.

The controller 25 may be programmed to model an open-circuit voltage, which as known in the art cannot be measured during dynamic operation of the system 10, such as while driving the vehicle of FIG. 1 when the torque-generating system 10 is so embodied. That is, the terminal voltage of the battery pack 12 changes dynamically due to electrochemical effects within battery cells 12C of the battery pack 12, with the open-circuit voltage being the value that the battery voltage will eventually reach if a load is applied to the battery pack 12 is removed. If the battery voltage drops too low during dynamic operation of the system 10, however, undesirable electrochemical reactions may result, and therefore the controller 25 uses the reactive voltage limit control actions noted above to prevent such an occurrence.

However, the fact that conventional reactive voltage limit control actions are reactive, i.e., conducted after a cell voltage level has already dropped too low, can adversely affect the predictive accuracy of the above-described future power estimations. The method 100 is therefore intended to improve the accuracy of power estimation in the face of reactive cell voltage limit control actions, specifically by tracking the history of prior voltage limit adjustments made under similar operating conditions and then accounting for the same during the power estimation processes, as will be set forth below in further detail with reference to FIGS. 2 and 3.

The example torque-generating system 10 shown in FIG. 1 may include an electrified powertrain 15 in which one or more electric machines 16 draw electrical power from the battery pack 12 and deliver motor torque to drive wheels 17 via one or more front and/or rear drive axles. An optional internal combustion engine 14 may be used in some configurations, such as when the system 10 is embodied as a hybrid electric or extended-range electric vehicle. Although shown as an example passenger vehicle, the system 10 may be embodied as any mobile or static platform whose battery pack 12 can be selectively recharged via regeneration and/or by connection to an offboard power supply (not shown) such as a 120 VAC or 240 VAC wall outlet or electric charging station, or via onboard regenerative charging of the type known in the art.

In all embodiments, the battery pack 12 has a plurality of the battery cells 12C, each of which has a corresponding battery cell voltage (arrow $V_{12C}$) that may be individually measured and/or calculated by a corresponding sensor 19, e.g., a voltage or current sensor, which typically may be configured as a cell sensing circuit or circuit board. Additionally, the controller 25 calculates or otherwise determines an average pack voltage (arrow $V_{AVG}$), e.g., by modeling the pack voltage using a circuit model and dividing the modeled pack voltage by the number of battery cells 12C used in the battery pack 12, as is well known in the art.

The controller 25 may be embodied as one or more distinct devices, each possibly having one or more microcontrollers or central processing units (P) and memory (M), e.g., read only memory, random access memory, and electrically-erasable programmable read only memory. The controller 25 may be configured to run/execute various software programs, including the method 100, in the overall operation of the battery pack 12 and the torque-generating system 10. Additionally, the controller 25 can output a control signal (arrow $CC_O$) to the battery pack 12 to control the same, including performing control actions such as electric range estimations, controlling a mode of the powertrain 15, and the like. The controller 25 may also use the predicted power to schedule impending mode shifts of the powertrain 15, to turn the engine 14 and/or electric machine 16 on or off, for route planning, for displaying a remaining electric range, or any other suitable control action that may benefit from improved power estimation accuracy.

Central to the present method 100 is the accurate estimation of maximum charge/discharge power of the battery pack 12. As noted above, the controller 25 can estimate the maximum power over any number of impending time windows using a maximum charge/discharge current and a maximum charge/discharge voltage, either or both of which may be measured by the sensor 19 and/or calculated, with the controller 25 selecting the lesser of the two values. The controller 25 dynamically adjusts a voltage control limit, i.e., a voltage floor, in logic to help protect the weakest of the battery cells 12C. To improve accuracy of the power estimations, the method 100 contemplates tracking and recording past movement of the voltage control limit over time and estimating power capability using the recorded movement history.

The controller 25 of FIG. 1 may selectively adjust the voltage control limit based on the magnitude of a voltage spread. As used herein, the term "voltage spread" refers to the difference between a pack voltage average ($V_{AVG}$) for the battery pack 12 and a minimum cell voltage ($V_{MIN,C}$) of the battery cells 12C, or alternatively in a battery module or smaller battery section of the battery pack 12. As is known in the art, a battery pack voltage is typically modeled using an equivalent circuit model for the battery pack 12, although the pack voltage could be calculated or determined in other ways within the intended scope of the disclosure. The pack voltage average ($V_{AVG}$) may be calculated by dividing the modeled, calculated, or otherwise determined pack voltage ($V_B$) by the number of battery cells 12C used in the battery pack 12, i.e., $$V_{AVG} = \frac{V_B}{\#Cells}$$

The voltage spread ($V_S$) is then calculated as follows:

$$V_S = V_{AVG} - V_{MIN,C}$$

As part of the present method 100, the controller 25 of FIG. 1 then tracks the historical adjustment of the voltage control limit to determine the voltage spread, with such adjustments possible made in a manner that is proportional to the magnitude of the voltage spread, and then accounts for the voltage spread during power estimation and other control actions of the battery pack 12. The present approach is rooted in the recognition, made herein, that the occurrence of a voltage spread of a large magnitude is a relatively repeatable, condition-specific phenomenon, e.g., the voltage spread tends to appear under substantially the same operating conditions, such as a recurrence of the same battery temperature and state of charge. The controller 25 therefore tracks historical trends in voltage control limit adjustments and uses the historical trends without modelling battery dynamics, which can be extremely non-linear at low states of charge. Application of the method 100 to the torque-generating system 10 of FIG. 1 will now be described with particular reference to FIGS. 2 and 3.

Figure 2:
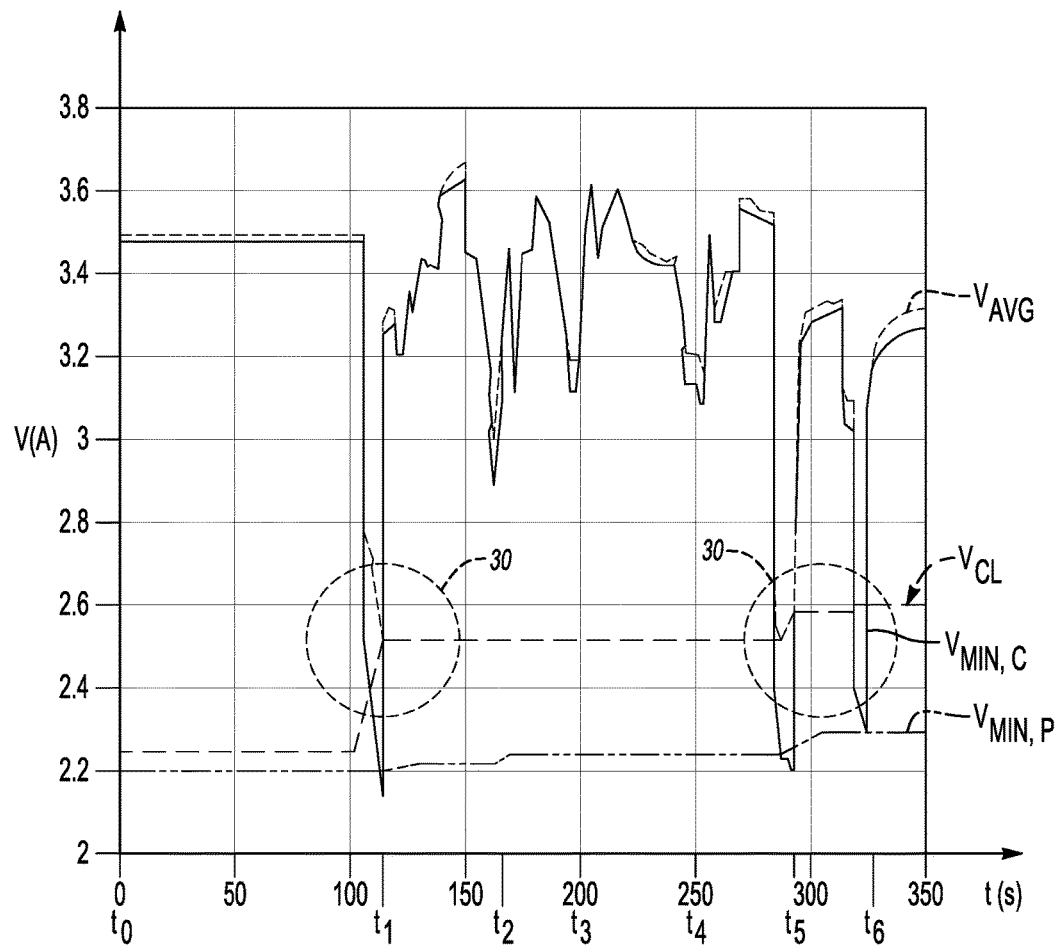
FIG. 2 is a time plot describing voltage limits used as part of the method described herein, with time depicted on the horizontal axis and voltage depicted on the vertical axis.

FIG. 2 depicts a time plot describing electrical values that are measured or controlled as part of the method 100, with voltage (V) depicted on the vertical axis and time (t) depicted on the horizontal axis. The average pack voltage ($V_{AVG}$) and minimum cell voltage ($V_{MIN,C}$) for the battery pack 12 decrease rapidly at $t_1$, $t_2$, $t_3$, $t_4$, $t_5$, and $t_6$, which is indicative of a discharge event in which there is a large outflow of electrical power from the battery pack 12. The average pack voltage ($V_{AVG}$) increases immediately after such discharge events, signaling a charging event in which the battery cells 12C of FIG. 1 are recharged. Zones 30 depict voltage spread of a large magnitude. That is, while the average pack voltage ($V_{AVG}$) and the minimum cell voltage ($V_{MIN,C}$) are not perfectly matched at other times, during some conditions the difference or offset can become pronounced, which if sufficiently large relative to a calibrated voltage spread threshold, can serve as a control trigger for reactively adjusting a voltage control limit ($V_{CL}$) as part of the method 100.

The method 100 described in more detail below with reference to FIG. 3 generally includes determining an individual cell voltage for each of the battery cells 12C, e.g., via direct measurement by a respective sensor 19 as noted above, and then increasing the voltage control limit ($V_{CL}$) when the lowest cell voltage relative to that of the other battery cells 12C in the battery pack 12 is less than the voltage control limit ($V_{CL}$). The control action can be seen at $t_1$, $t_5$, and $t_6$ of the non-limiting illustration in FIG. 2. As noted above, the method 100 includes recording an amount of the increase in memory (M) of the controller, e.g., in a designated memory location referenced by operating conditions such as state of charge and temperature of the battery pack 12 at the time the increase was commanded.

The controller 25 then estimates a power capability of the battery pack 12 using a voltage that is first adjusted by the recorded amount of the prior increase under the same operating conditions, i.e., in proactive anticipation of the voltage limit control action that will take place after power estimation has commenced. In this way, the controller 25 can use a more accurate pack voltage value to estimate the future power capability. The controller 25 ultimately executes a control action of the system 10 using the more accurately estimated power capability.

Between $t_0$ and $t_1$, the calibrated cell voltage control limit ($V_{CL}$), which is a predetermined value that is selectively adjusted as needed, is initially maintained at a level that is a calibrated offset from the minimum pack voltage ($V_{MIN,P}$), i.e., a minimum allowable voltage for the battery pack 12 as a whole. The cell voltage control limit ($V_{CL}$) serves as a reference that ultimately triggers certain control actions with respect to the battery pack 12 or torque-generating system 10.

For example, at $t_1$ the minimum cell voltage ($V_{MIN,C}$) drops below a level of the calibrated cell voltage control limit ($V_{CL}$). The cell spread described above increases substantially in regions 30. In response, the controller 25 automatically adjusts the cell voltage control limit ($V_{CL}$) upward by a predetermined amount at $t_1$ and then maintains the new higher limit until the next instance in which the cell voltage control limit ($V_{CL}$) is violated, which occurs at about is in the example of FIG. 2. The controller 25 again increases the voltage control limit ($V_{CL}$) at $t_5$, and then again at $t_6$.

The amount of each adjustment to the voltage control limit ($V_{CL}$) may be based on the magnitude of the voltage spread that is present when the adjustment is made. The controller 25 can store the historical data in data bins or memory locations corresponding to the operating conditions of the battery pack 12 as a whole when the adjustment is made. When the torque-generating system 10 again functions under operating conditions that are substantially the same as the those that were present when the adjustments were made, and if power capability estimation is required under substantially the same operating conditions, the controller 25 performs the power estimation using the adjusted voltage, knowing beforehand from the recorded history that the voltage control limit will likely increase as a result of the reactive voltage limit control actions.

Also shown in FIG. 2 is a calibrated minimum pack voltage ($V_{MIN,P}$), which is a calibrated minimum pack voltage for the battery pack 12 as a whole. This value trends upward with each adjustment of the calibrated cell voltage control limit ($V_{CL}$). The overall pack voltage of the battery pack 12 is controlled by operation of the controller 25 so that the minimum cell voltage ($V_{MIN,C}$) is not less than the minimum pack voltage ($V_{MIN,P}$). Thus, the minimum pack voltage ($V_{MIN,P}$) is automatically and selectively increased over time as shown in FIG. 2 in response to periodic adjustment of the voltage control limit ($V_{CL}$), which in turn occurs when a given battery cell 12C drops below the minimum cell voltage limit ($V_{MIN,C}$).

Figure 3:
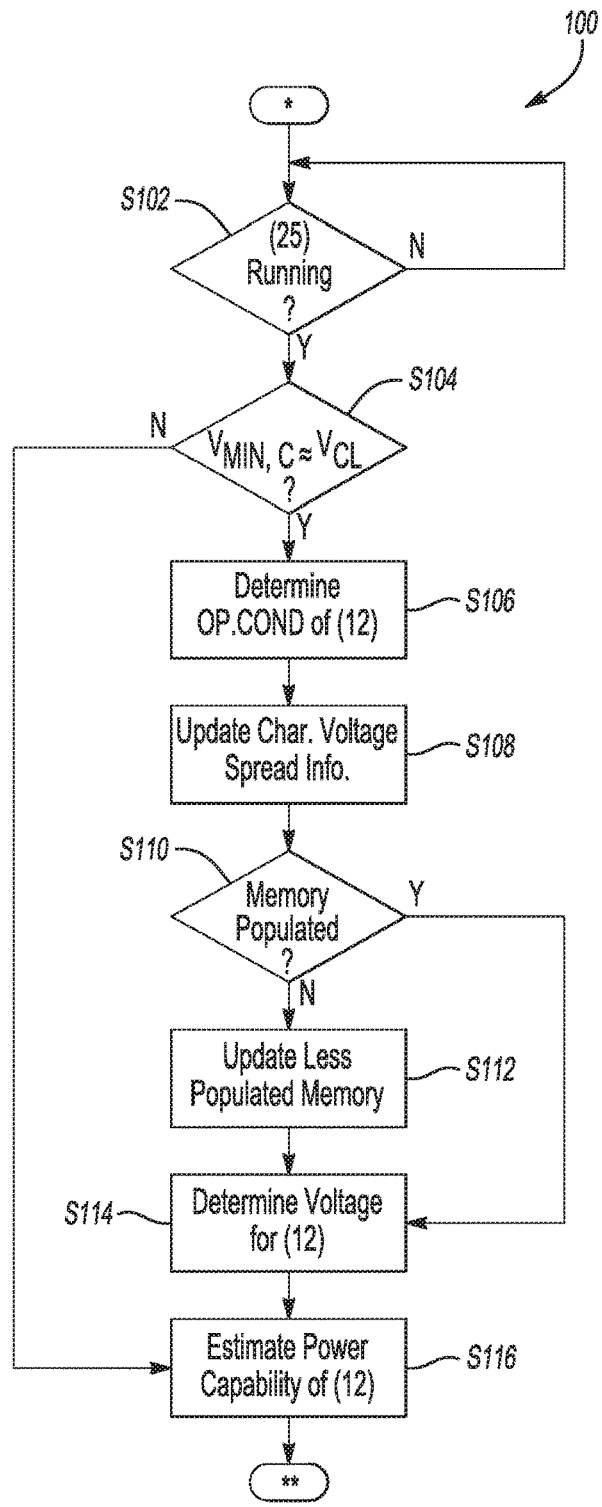
FIG. 3 is a flow chart describing an example embodiment of the method disclosed herein.

An example embodiment of the method 100 is shown in FIG. 3. The method 100 in this embodiment may include collecting voltage spread data over time for different operating conditions and recording the magnitude of such adjustments to the voltage control limit ($V_{CL}$) over time. Different time windows such as 2 s and 10 s can be used for this purpose, as power estimation is ultimately made by the controller 25 for different future or impending time windows in the process of controlling the system 10 of FIG. 1. That is, the controller 25 can predict how much battery power will be available for allocation to the electric machine 15 over a future time interval. Using this prediction, the controller 25 can control operation of the system 10 using more accurate power estimates than would be available absent the method 100.

After the method 100 commences (*), the controller 25 determines at step S102 whether the controller 25 is running. Step S102 may include detecting an ignition or key-on event of the system 10, or otherwise evaluating whether the controller 25 is awake and operational, and that conditions are appropriate for continuing with execution of the method 100. The controller 25 proceeds to step S104 only when such conditions are present.

Step S104 includes determining whether the minimum cell voltage ($V_{MIN,C}$) is nearing or lower than the voltage control limit ($V_{CL}$), i.e., a cell voltage floor, which may be recorded in the memory (M) of the controller 25 as a calibrated value. If so, the method 100 proceeds to step S106 and prepares to increase the voltage control limit ($V_{CL}$). Adjustment may occur in some embodiments only if the voltage spread exceeds a calibrated voltage spread threshold, e.g., to prevent making unnecessary adjustments. The method 100 proceeds instead to step S116 when the minimum cell voltage ($V_{MIN,C}$) is not nearing or lower than the voltage control limit ($V_{CL}$).

At step S106, the controller 25 next determines operating conditions of the battery pack 12, e.g., the state of charge and temperature of the battery pack 12 as noted above, via measurement or reporting via another control module (not shown), and then identifies the appropriate corresponding memory location in memory (M). For example, a plurality of memory locations may be reserved in memory (M), e.g., as one or more lookup tables. By way of illustration, battery temperature may be divided into bands of 10° C., e.g., from −40° C. to 40° C., and state of charge may be divided into 10% bands ranging from 0% to 100% state of charge, with different combinations of these bands stored in the lookup tables.

Based on the current state of charge and temperature of the battery pack 12, the controller 25 can then select the corresponding memory location for the operating conditions under which the voltage spread and voltage limit adjustments are being considered. Step S106 may be used because, as noted above, voltage spread is correlated with state of charge and temperature of a battery pack 12 over time in a given torque-generating system 10, and may also be sufficiently correlated with other operating conditions. The controller 25 proceeds to step S108 when the memory locations have been identified.

At step S108, the controller 25 of FIG. 1 updates characteristic voltage spread information for the identified memory location from step S110. Step S108 entails determining the magnitude of the voltage spread or cell spread as explained above and recording the same in the corresponding memory location. The method 100 then proceeds to step S110.

Step S110 includes determining whether all memory locations have been populated, particularly those that might not be sufficiently populated. For instance, when the torque-generating system 10 is a vehicle, an operator may infrequently discharge the battery pack 12, or may continue to charge the battery pack 12 to a high state of charge and maintain the high state of charge for various reasons, including range anxiety, short commuting distances, or charging habits. The method 100 proceeds to step S112 if all memory locations have not been populated, and to step S114 in the alternative when all memory locations have been populated.

Step S112 includes updating the voltage spread information at the less populated memory locations and proceeding to step S114.

At step S114, the controller 25 of FIG. 1 determines a battery pack voltage to use for power estimation, doing so for a given state of charge/temperature memory location. For instance, the controller 25 may extract the recorded history or characteristic voltage spread from a particular memory location corresponding to the present operating conditions. The method 100 then proceeds to step S116.

At step S116, the controller 25 estimates a power capability of the battery pack 12 using voltage from step S114 and records the same, then executes a control action using the estimated power capability as explained above.

Therefore, by using the method 100 the controller 25 can more accurately predict when an upward movement of the cell voltage control limit ($V_L$) will occur by assuming a repetition of the historical trend of past control adjustments under the same operating conditions. While the offset levels used for past adjustments of the voltage control limit ($V_{CL}$) under the same operating conditions, whether state of charge and temperature-dependent or otherwise, may not always be identical to impending adjustments, the proactive use of the historical trends in reactive control of the lower voltage limit is intended to reduce power prediction errors and improve control of the system 10.

As used herein with respect to any disclosed values or ranges, the term "about" indicates that the stated numerical value allows for slight imprecision, e.g., reasonably close to the value or nearly, such as ±10 percent of the stated values or ranges. If the imprecision provided by the term "about" is not otherwise understood in the art with this ordinary meaning, then "about" as used herein indicates at least variations that may arise from ordinary methods of measuring and using such parameters. In addition, disclosure of ranges includes disclosure of all values and further divided ranges within the entire range.

While the best modes for carrying out the disclosure have been described in detail, those familiar with the art to which this disclosure relates will recognize various alternative designs and embodiments lying within the scope of the appended claims. It is intended that all matter contained in the above description and/or shown in the accompanying drawings shall be interpreted as illustrative only and not as limiting.

The invention claimed is:

1. A method for estimating battery power capability in a torque-generating system having a battery pack with a plurality of battery cells, the method comprising:
   calculating a voltage spread via a controller as a difference between an average and a minimum cell voltage of the battery pack;
   increasing a calibrated voltage control limit by an offset that is based on a magnitude of the voltage spread when the minimum cell voltage is less than the calibrated voltage control limit;
   recording the offset in a memory location of the controller that is referenced by operating conditions of the battery pack;
   estimating a power capability of the battery pack, using the recorded offset, when the battery pack is operating under conditions that are the same as the operating conditions; and
   executing, via the controller, a control action of the torque-generating system using the estimated power capability.

2. The method of claim 1, wherein the operating conditions of the battery pack include a state of charge or a temperature of the battery pack.

3. The method of claim 2, wherein the operating conditions of the battery pack include the state of charge and the temperature of the battery pack.

4. The method of claim 1, further comprising measuring a cell voltage for each of the battery cells using a voltage sensor.

5. The method of claim 1, wherein estimating a power capability of the battery pack includes estimating each of a maximum charging power capability and a maximum discharging power capability over a plurality of different future time windows.

6. The method of claim 1, wherein increasing the calibrated voltage control limit occurs only when the magnitude of the voltage spread exceeds a calibrated voltage spread threshold.

7. The method of claim 1, wherein the torque-generating system includes an engine, and wherein the control action includes commanding the engine to turn on or off.

8. The method of claim 1, wherein the torque-generating system is a vehicle, and wherein the control action includes executing a route planning action of the vehicle.

9. The method of claim 1, wherein estimating the power capability of the battery pack using the recorded offset includes adjusting a voltage of the battery pack by an amount that is proportional to the magnitude of the voltage spread, and then calculating the power capability using the adjusted voltage.

10. A torque-generating system comprising:
a battery pack having a plurality of battery cells;
an electric machine operable for generating output torque when supplied with electricity from the battery pack; and
a controller in communication with the battery pack, wherein the controller is programmed to:
calculate a voltage spread as a difference between an average and a minimum cell voltage of the battery pack;
increase a calibrated voltage control limit by an offset that is based on a magnitude of the voltage spread when the minimum cell voltage is less than the calibrated voltage control limit;
record the offset in a memory location of the controller that is referenced by operating conditions of the battery pack;
estimate a power capability of the battery pack, using the recorded offset, when the battery pack is operating under conditions that are the same as the operating conditions; and
execute a control action of the torque-generating system using the estimated power capability.

11. The torque-generating system of claim 10, further comprising a set of drive wheels connected to the electric machine, wherein the torque-generating system is a vehicle having an electrified powertrain that includes the electric machine.

12. The torque-generating system of claim 10, wherein the operating conditions of the battery pack include a state of charge or a temperature of the battery pack.

13. The torque-generating system of claim 12, wherein the operating conditions of the battery pack include the state of charge and the temperature of the battery pack.

14. The torque-generating system of claim 10, further comprising a plurality of voltage sensors each operable for measuring a cell voltage for a corresponding one of the battery cells.

15. The torque-generating system of claim 10, wherein the controller is programmed to estimate the power capability of the battery pack by estimating each of a maximum charging power capability and a maximum discharging power capability over a plurality of different future time windows.

16. The torque-generating system of claim 10, wherein the controller is programmed to increase the calibrated voltage control limit occurs only when the magnitude of the voltage spread exceeds a calibrated voltage spread threshold.

17. The torque-generating system of claim 10, further comprising an engine, wherein the controller is programmed to command the engine to turn on or off as the control action.

18. The torque-generating system of claim 10, wherein the torque-generating system is a vehicle, and wherein the controller is programmed to execute a route planning action of the vehicle as the control action.

19. The torque-generating system of claim 10, wherein the controller is programmed to estimate the power capability of the battery pack using the recorded offset by adjusting a voltage of the battery pack by an amount that is proportional to the magnitude of the voltage spread, and then calculating the power capability using the adjusted voltage.

* * * * *